(12) United States Patent
Yuan et al.

(10) Patent No.: US 11,927,603 B2
(45) Date of Patent: Mar. 12, 2024

(54) PROBES THAT DEFINE RETROREFLECTORS, PROBE SYSTEMS THAT INCLUDE THE PROBES, AND METHODS OF UTILIZING THE PROBES

(71) Applicant: FormFactor, Inc., Livermore, CA (US)

(72) Inventors: Quan Yuan, Dublin, CA (US); Joseph George Frankel, Beaverton, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/954,093

(22) Filed: Sep. 27, 2022

(65) Prior Publication Data
US 2023/0117566 A1    Apr. 20, 2023

Related U.S. Application Data

(60) Provisional application No. 63/257,868, filed on Oct. 20, 2021.

(51) Int. Cl.
G01R 1/067    (2006.01)

(52) U.S. Cl.
CPC ..... *G01R 1/06794* (2013.01); *G01R 1/06738* (2013.01)

(58) Field of Classification Search
CPC ............ G01R 1/06794; G01R 1/06738; G01R 31/2891; G01R 1/06733
See application file for complete search history.

(56) References Cited

U.S. PATENT DOCUMENTS

| | | | |
|---|---|---|---|
| 4,115,736 | A | 9/1978 | Tracy |
| 6,710,798 | B1 | 3/2004 | Hershel et al. |
| 6,924,653 | B2 | 8/2005 | Schaeffer et al. |
| 6,933,738 | B2 | 8/2005 | Martin et al. |

(Continued)

FOREIGN PATENT DOCUMENTS

| | | |
|---|---|---|
| JP | 2004101308 A | 4/2004 |
| TW | 201945688 A | 12/2019 |
| TW | 202127050 | 7/2021 |

OTHER PUBLICATIONS

English-language machine translation of Taiwan Publication No. 201945688A, Dec. 1, 2019.

(Continued)

*Primary Examiner* — Lee E Rodak
(74) *Attorney, Agent, or Firm* — KOLITCH ROMANO DASCENZO GATES LLC

(57) ABSTRACT

Probes that define retroreflectors, probe systems that include the probes, and methods of utilizing the probes. The probes include the retroreflector, which is defined by a retroreflector body. The retroreflector body includes a first side, an opposed second side, a tapered region that extends from the first side, and a light-receiving region that is defined on the second side. The probes also include a probe tip, which is configured to provide a test signal to a device under test (DUT) and/or to receive a resultant signal from the DUT. The retroreflector is configured to receive light, via the light-receiving region, at a light angle of incidence. The retroreflector also is configured to emit at least an emitted fraction of the light, from the retroreflector body and via the light-receiving region, at a light angle of emission that is at least substantially equal to the light angle of incidence.

24 Claims, 12 Drawing Sheets

(56) References Cited

U.S. PATENT DOCUMENTS

| | | |
|---|---|---|
| 7,348,786 B2 | 3/2008 | Thacker et al. |
| 7,355,422 B2 | 4/2008 | Walker |
| 7,459,923 B2 | 12/2008 | Caldwell et al. |
| 7,538,564 B2 | 5/2009 | Ehrmann et al. |
| 7,586,608 B1 | 9/2009 | Gunn, III et al. |
| 7,634,128 B2 | 12/2009 | Snow et al. |
| 8,531,202 B2 | 9/2013 | Mok et al. |
| 9,804,196 B2 | 10/2017 | Bolt et al. |
| 11,313,936 B2 | 4/2022 | Frankel et al. |
| 2002/0156363 A1 | 10/2002 | Hunter et al. |
| 2003/0174401 A1 | 9/2003 | Brunner et al. |
| 2007/0132465 A1 | 6/2007 | Kreissig et al. |
| 2008/0030214 A1 | 2/2008 | Nguyen et al. |
| 2009/0065583 A1 | 3/2009 | McGrew |
| 2010/0064784 A1 | 3/2010 | Caudill et al. |
| 2010/0069746 A1 | 3/2010 | St. John |
| 2010/0277193 A1 | 11/2010 | Yonezawa |
| 2011/0089965 A1 | 4/2011 | Endres et al. |
| 2011/0126631 A1* | 6/2011 | Bach .................. G01D 5/30 356/614 |
| 2014/0021970 A1 | 1/2014 | Endres et al. |
| 2015/0079501 A1 | 3/2015 | Shoki et al. |
| 2015/0116164 A1 | 4/2015 | Mannion et al. |
| 2016/0161294 A1 | 6/2016 | Ip et al. |
| 2017/0205443 A1 | 7/2017 | Bolt et al. |
| 2019/0227102 A1* | 7/2019 | Frankel ............. G01R 1/06727 |
| 2023/0058964 A1* | 2/2023 | Giessmann ........ G01R 1/06772 |

OTHER PUBLICATIONS

English-language machine translation of Japanese Publication No. 2004101308A, Apr. 2, 2004.

English-language abstract of Japanese Publication No. 2004101308A, Apr. 2, 2004.

\* cited by examiner

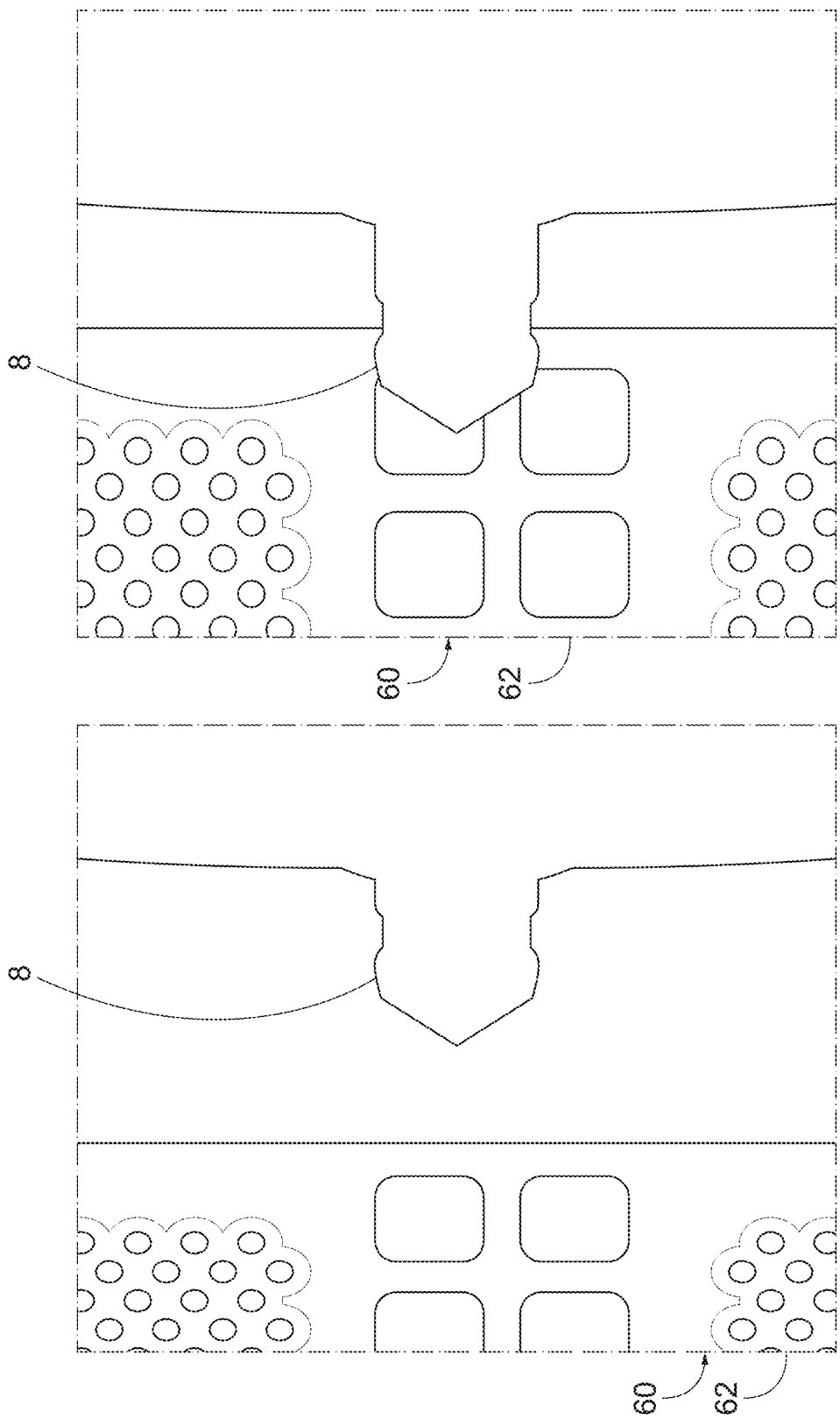

PROBES THAT DEFINE RETROREFLECTORS, PROBE SYSTEMS THAT INCLUDE THE PROBES, AND METHODS OF UTILIZING THE PROBES

RELATED APPLICATION

This application claims priority to U.S. Provisional Patent Application No. 63/257,868, which was filed on Oct. 20, 2021, and the complete disclosure of which is hereby incorporated by reference.

FIELD OF THE DISCLOSURE

The present disclosure relates generally to probes that define retroreflectors, to probe systems that include the probes, and/or to methods of utilizing the probes.

BACKGROUND OF THE DISCLOSURE

Probe systems may be utilized to test the operation and/or performance of a device under test (DUT) by providing test signals to the DUT and/or receiving resultant signals from the DUT. In order to accurately convey signals between the probe system and the DUT, one or more probes of the probe system may be aligned with one or more corresponding coupling regions of the DUT, and it may be necessary for this alignment to be highly accurate and precise, with tolerances on the order of a few micrometers. It follows then that aligning a probe with the DUT requires very accurate and precise measurement and manipulation of the locations of the probe and/or the coupling region, such as a height of the probe relative to the coupling region and/or a relative orientation between the probe and the coupling region.

Probe systems often include an imaging device, which may be utilized to facilitate alignment between the probe and the coupling region. While effective in certain circumstances, conventional probe systems that utilize conventional probes may exhibit a number of drawbacks. As an example, it may be difficult to precisely measure a height of the probe above the DUT. As another example, it often may be difficult to differentiate the probe from the DUT, especially in automated probe systems that may utilize automated routines to align the probe with the coupling region. An example of this difficulty is illustrated in FIGS. 1-2. As illustrated in FIG. 1, it generally may be feasible to determine a relative orientation between a conventional probe 8 and a substrate 60 that includes a device under test 62 when a region of the substrate that is immediately below the conventional probe is uniform and/or when there is contrast between the substrate and the probe. However, as illustrated in FIG. 2, it may be challenging, or even impossible, to accurately determine the relative orientation between the conventional probe and the substrate when the region of the substrate that is immediately below the conventional probe is not uniform, wherein there is structural variation on the substrate beneath the conventional probe, and/or when there is insufficient contrast between the substrate and the probe. This difficulty may be exacerbated when electronic algorithms and/or automated routines are utilized to align the probe with the substrate and/or with the DUT. Thus, there exists a need for improved probes that define retroreflectors and/or for improved probe systems and methods that include and/or utilize the probes.

SUMMARY OF THE DISCLOSURE

Probes that define retroreflectors, probe systems that include the probes, and methods of utilizing the probes are disclosed herein. The probes include the retroreflector, which is defined by a retroreflector body. The retroreflector body includes a first side, an opposed second side, a tapered region that extends from the first side, and a light-receiving region that is defined on the second side. The probes also include a probe tip, which is configured to provide a test signal to a device under test (DUT) and/or to receive a resultant signal from the DUT. The retroreflector is configured to receive light, via the light-receiving region, at a light angle of incidence. The retroreflector also is configured to emit at least an emitted fraction of the light, from the retroreflector body and via the light-receiving region, at a light angle of emission that is at least substantially equal to the light angle of incidence.

The probe systems are configured to test a DUT that is formed on a substrate. The probe systems include a chuck configured to support the substrate and the probe. The probe systems also include a light source configured to direct light toward the light-receiving region at the light angle of incidence. The probe systems further include an imaging device configured to receive the emitted fraction of the light from the retroreflector at least substantially at the light angle of emission.

The methods include methods of utilizing the probes and include directing light toward the retroreflector such that at least a fraction of the light is incident upon the light-receiving region at the light angle of incidence. The methods also include internally reflecting at least a reflected fraction of the light within the retroreflector body and emitting the emitted fraction of the reflected fraction of the light from the retroreflector body, via the light-receiving region, and at the light angle of emission. The methods further include scattering a remainder of the light such that the remainder of the light propagates from the retroreflector at an angle other than the light angle of emission.

BRIEF DESCRIPTION OF THE DRAWINGS

FIG. 1 is an image of a conventional probe above a substrate.

FIG. 2 is another image of a conventional probe above a substrate.

DETAILED DESCRIPTION AND BEST MODE OF THE DISCLOSURE

Figure 3:
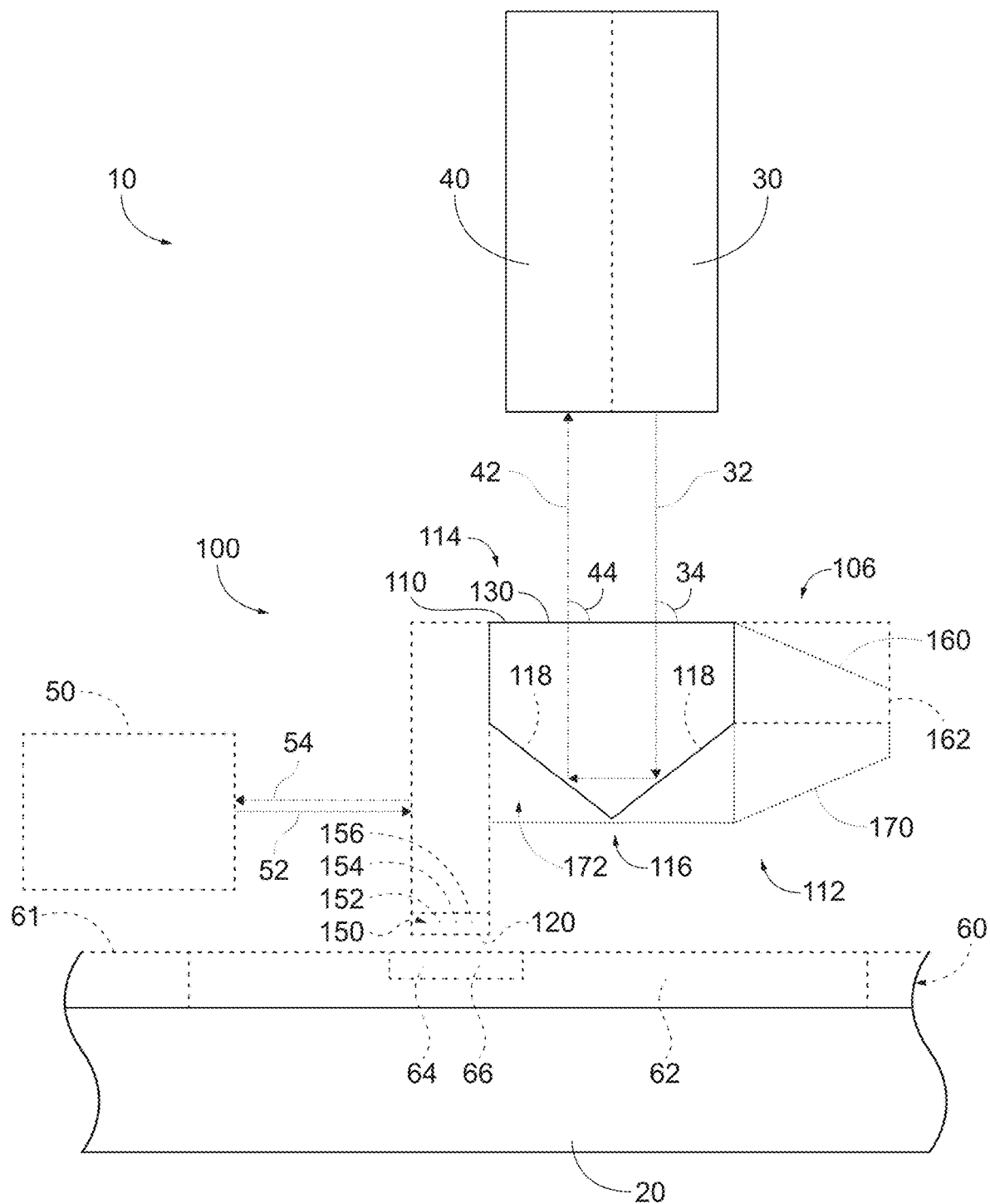
FIG. 3 is a schematic illustration of examples of probes that include retroreflectors and that may be included within probe systems, according to the present disclosure.

FIGS. 3-21 provide examples of retroreflectors 106, of probes 100 that include retroreflectors 106, of probe systems 10 that include probes 100, of light reflection from retroreflectors 106 of probes 100, and/or of methods 200, according to the present disclosure. Elements that serve a similar, or at least substantially similar, purpose are labeled with like numbers in each of FIGS. 3-20, and these elements may not be discussed in detail herein with reference to each of FIGS. 3-20. Similarly, all elements may not be labeled in each of FIGS. 3-20, but reference numerals associated therewith may be utilized herein for consistency. Elements, components, and/or features that are discussed herein with reference to one or more of FIGS. 3-20 may be included in and/or utilized with any of FIGS. 3-20 without departing from the scope of the present disclosure. In general, elements that are likely to be included in a particular embodiment are illustrated in solid lines, while elements that are optional are illustrated in dashed lines. However, elements that are shown in solid lines may not be essential to all embodiments and, in some embodiments, may be omitted without departing from the scope of the present disclosure.

Figure 4:
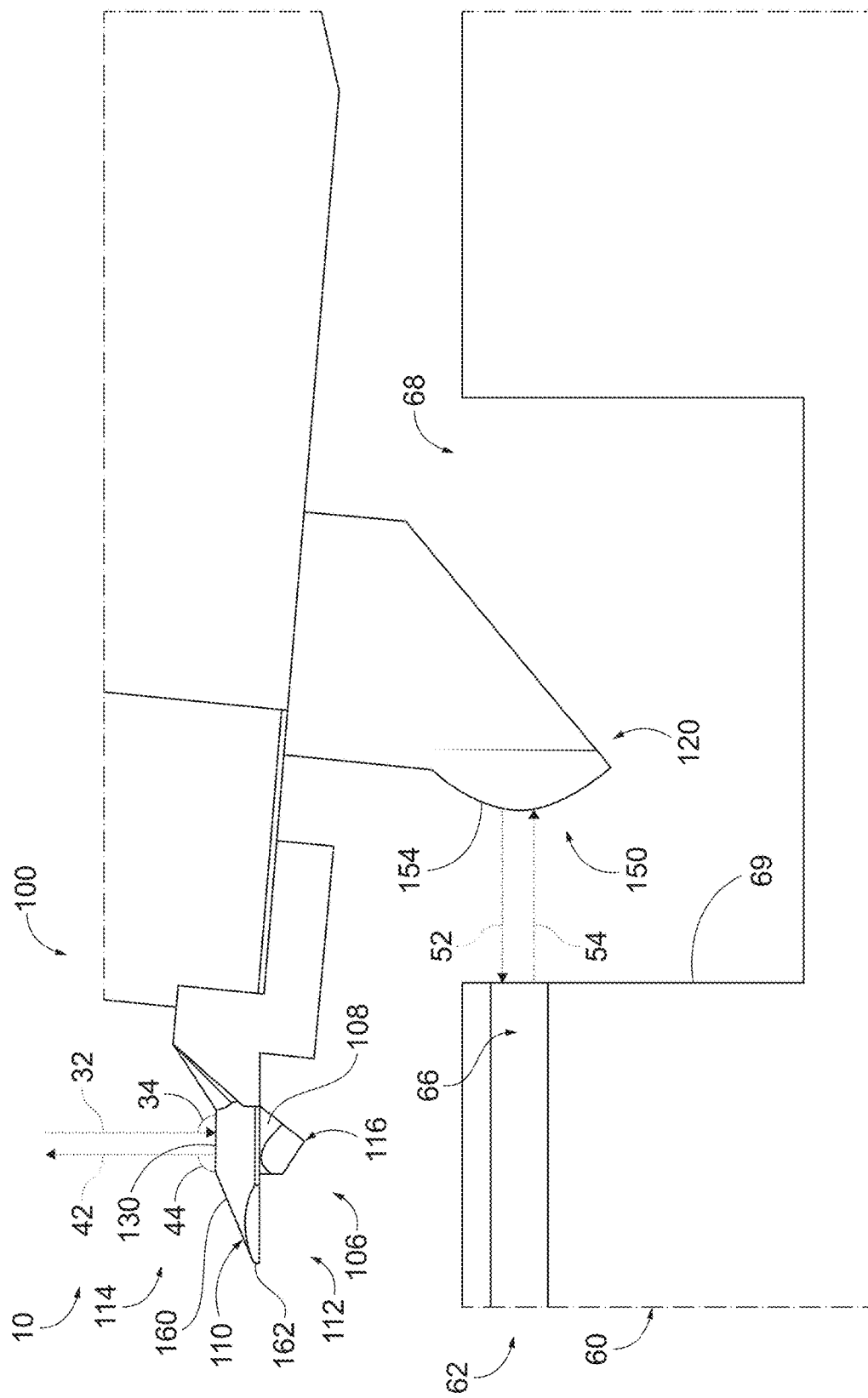
FIG. 4 is a less schematic illustration of an example of a probe that includes a retroreflector and that may be included within probe systems, according to the present disclosure.
Figure 5:
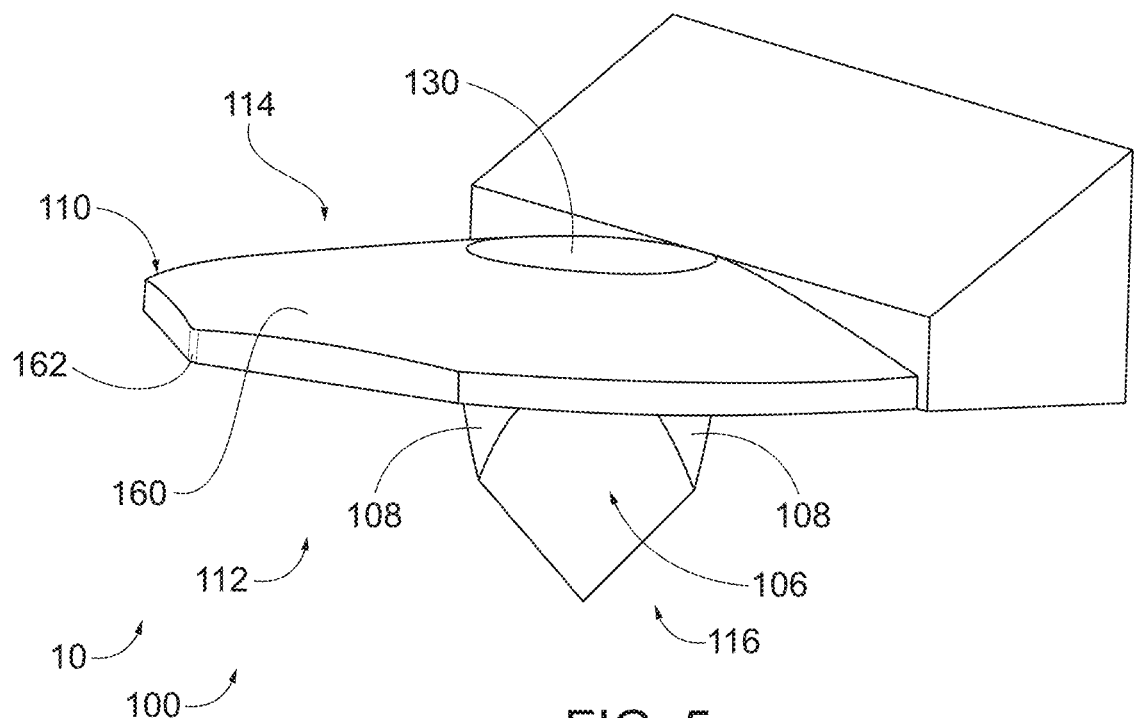
FIG. 5 is a schematic perspective view of an example of a retroreflector that may form a portion of a probe according to the present disclosure.
Figure 6:
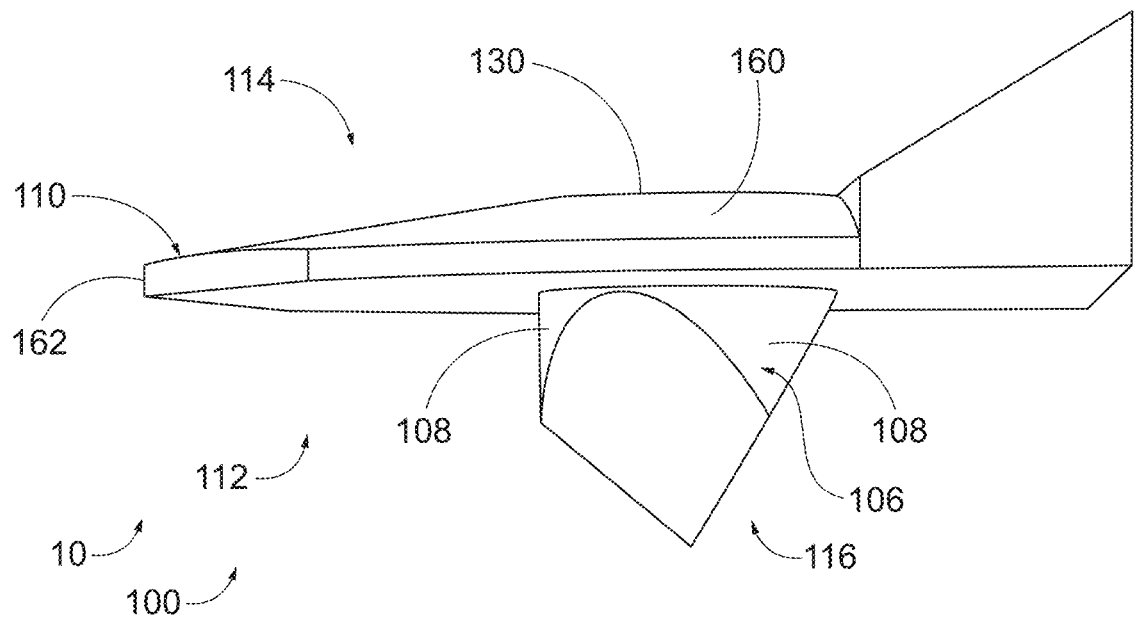
FIG. 6 is a schematic side view of the retroreflector of FIG. 5.
Figure 7:
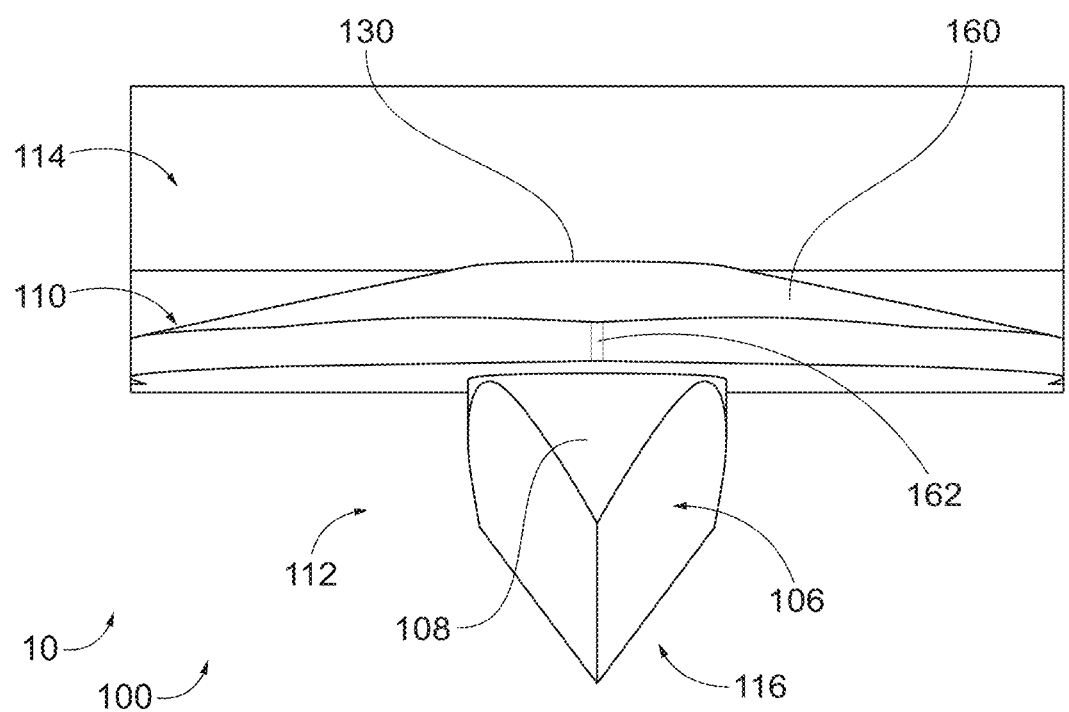
FIG. 7 is a schematic front view of the retroreflector of FIGS. 5-6.

FIG. 3 is a schematic illustration of examples of probes 100 that include retroreflectors 106 and may be included within probe systems 10, according to the present disclosure. FIG. 4 is a less schematic illustration of an example of a probe 100 that includes a retroreflector 106 and that may be included within probe systems 10, according to the present disclosure. Probe systems 10 may be configured to test a device under test (DUT) 62, which may be formed on a substrate 60. Examples of the DUT include a semiconductor device, an electronic device, an optical device, and/or an optoelectronic device. Examples of the substrate include a wafer, a semiconductor wafer, a silicon wafer, a gallium arsenide wafer, and/or a type III-V semiconductor wafer.

As illustrated in FIG. 3, and in addition to at least one probe 100, probe systems 10 include a chuck 20, a light source 30, and an imaging device 40. FIG. 3 illustrates an example of probe systems 10 that are configured to test, or interface with, DUT 62 via an upper surface 61 of substrate 60, while FIG. 4 illustrates an example of probe systems 10 configured to test, or interface with, DUT 62 via a trench 68 that is defined within substrate 60, such as via a side wall 69 of the trench. Examples of light source 30 include any suitable structure that may be configured to emit electromagnetic radiation, light, and/or visible light, such as an LED light source and/or a laser light source. Examples of imaging device 40 include a camera, a video camera, a microscope, and/or a charge coupled device.

During operation of probe systems 10, such as to test, or to test the operation of, DUT 62, substrate 60 may be supported by and/or on chuck 20. In addition, light source 30 may emit light 32 and/or may direct the light toward and/or incident upon a light-receiving region 130 of retroreflector 106 at a light angle of incidence 34. Retroreflector 106 may be configured to receive light 32 from light-receiving region 130 and to emit an emitted fraction 42 of the light. Emitted fraction 42 may be emitted from light-receiving region 130 at a light angle of emission 44, which may be equal to, at least substantially equal to, and/or equivalent to light angle of incidence 34. Emitted fraction 42 then may be received by imaging device 40, thereby permitting and/or facilitating generation of an image with and/or by the imaging device.

Light angle of emission 44 may have any suitable value relative to light angle of incidence 34. In some examples, emitted fraction 42 may propagate parallel, or at least substantially parallel, to light 32. In such examples, light angle of emission 44 may be equal, or at least substantially equal, to light angle of incidence 34. In some examples, light angle of emission 44 may differ, or may differ slightly, from light angle of incidence 34, such as by less than a threshold angle difference.

Light 32 and/or emitted fraction 42 may be incident upon light-receiving region 130 parallel, or at least substantially parallel, to a surface normal direction of the light-receiving region. Stated differently, light angle of incidence 34 and/or light angle of emission 44 may be equal, or at least substantially equal, to 90 degrees. However, this is not required, and it is within the scope of the present disclosure that light angle of incidence 34 and/or light angle of emission 44 may differ from 90 degrees by the threshold angle difference. Examples of the threshold angle difference include threshold angles of 5 degrees, 4.5 degrees, 4 degrees, 3.5 degrees, 3 degrees, 2.5 degrees, 2 degrees, 1.5 degrees, 1 degree, 0.5 degrees, 0.25 degrees, or 0.1 degree. Stated differently, light angle of incidence 34 may be referred to herein as being "at least substantially equal" to light angle of emission 44 when the light angle of incidence differs from the light angle of emission by less than the threshold angle difference. Similarly, light 32 may be referred to herein as being "at least substantially parallel" to emitted fraction 42 when an angle between light 32 and emitted fraction 42 is less than the threshold angle difference. In addition, light 32 and emitted fraction 42 may be referred to herein as being incident upon light-receiving region 130 at least substantially parallel to the surface normal direction of the light-receiving region when an angle between light 32 and the surface normal direction and/or between emitted fraction 42 and the surface normal direction is less than the threshold angle difference.

As illustrated in dashed lines in FIG. 3, probe systems 10 may include a signal generation and analysis assembly 50. Signal generation and analysis assembly 50, when present, may be adapted, configured, designed, and/or constructed to provide a test signal 52 to DUT 62 via a probe tip 120 of probe 100 and/or to receive a resultant signal 54 from the DUT via the probe tip. Examples of the test signal include an electric test signal, an optical test signal, and/or an electromagnetic test signal. Examples of the resultant signal include an electric resultant signal, an optical resultant signal, and/or an electromagnetic resultant signal. Examples of signal generation and analysis assembly 50 include a signal generator, an electric signal generator, an optical signal generator, a signal transmitter, an electric signal transmitter, an optical signal transmitter, a signal receiver, an electric signal receiver, an optical signal receiver, a signal analyzer, an electric signal analyzer, and/or an optical signal analyzer.

FIG. 3 illustrates an example of probe tip 120 that may be configured to convey electric, optical, and/or electromagnetic test signals 52 and/or resultant signals 54. FIG. 4 illustrates an example of probe tip 120 that may be configured to convey optical and/or electromagnetic test signals 52 and/or resultant signals 54.

Turning now more generally to FIGS. 3-20, retroreflectors 106 include a retroreflector body 110 that defines a first side 112 and a second side 114. Second side 114 may be opposed to first side 112 and thus may be referred to as an opposed second side 114. Retroreflector body 110 also defines a tapered region 116, which extends and/or projects from first side 112, and light-receiving region 130, which is defined on second side 114. As discussed, and as illustrated in FIGS. 3-4, retroreflector 106 is configured to receive light 32 via light-receiving region 130 and at light angle of incidence 34. In addition, retroreflector 106 is configured to emit at least emitted fraction 42 of the light from retroreflector body 110, via light-receiving region 130, and at light angle of emission 44.

Retroreflector body 110 may include and/or be any suitable structure that may define first side 112, second side 114, tapered region 116, and light-receiving region 130. In some examples, retroreflector body 110 may include and/or be a monolithic retroreflector body and/or a unitary retroreflector body. Stated another way, retroreflector body 110 may be a single, monolithic, and/or unitary retroreflector body that defines at least the first side, the second side, the tapered region, and the light-receiving region.

In some examples, retroreflector body 110 may be formed via an additive manufacturing process. In some examples, the retroreflector body may include and/or be an optically transparent, or at least partially optically transparent, retroreflector body. In some examples, the retroreflector body may be formed from an optically transparent polymer. In some examples, the retroreflector body may have a refractive index of at least 1.4, at least 1.45, at least 1.5, at least 1.55, at least 1.7, at most 1.65, at most 1.6, at most 1.55, or at most 1.5.

As discussed, first side 112 and second side 114 may be opposed, or at least substantially opposed, to one another. In some examples, at least a portion and/or region of first side 112 may face away from a corresponding portion and/or region of second side 114. Additionally or alternatively, at least a portion and/or region of first side 112 may project away from a corresponding portion and/or region of second side 114. Additionally or alternatively, at least a portion and/or region of second side 114 may project away from a corresponding portion and/or region of first side 112. Stated differently, in some examples and when probes 100 are utilized within probe systems 10, first side 112 may be a lower side of the probe and/or may face toward DUT 62, while second side 114 may be an upper side of the probe, may face away from DUT 62, may face toward light source 30, and/or may face toward imaging device 40.

Light-receiving region 130 may include any suitable region and/or surface of retroreflector body 110 that may be adapted, configured, designed, shaped, and/or constructed to receive light 32 at light angle of incidence 34 and/or to emit emitted fraction 42 of the light at light angle of emission 44. As an example, light-receiving region 130 may include and/or be a planar, or at least substantially planar, light-receiving region and/or a planar, or at least substantially planar, surface of retroreflector body 110 and/or of second side 114. As another example, light-receiving region 130 may include and/or be a circular, an at least substantially circular, and/or an at least partially circular, region and/or surface of retroreflector body 110. As additional examples, light-receiving region 130 may be an optically transparent, or at least substantially optically transparent, light-receiving region and/or an optically transparent, or at least substantially optically transparent, surface region of retroreflector body 110.

In some examples, light-receiving region 130 may be configured to convey light 32 into retroreflector body 110 such that the light reflects within the retroreflector body and/or within retroreflector 106, which is defined by the retroreflector body. In some examples, light-receiving region 130 may be configured to emit emitted fraction 42 of the light from retroreflector body 110 subsequent to reflection of the light within retroreflector 106.

Retroreflector 106 may include and/or be any suitable structure that is defined by and/or within retroreflector body 110, that receives light 32 at light angle of incidence 34, and/or that emits emitted fraction 42 of the light at light angle of emission 44. As an example, and as illustrated in FIG. 3, retroreflector 106, and/or tapered region 116 thereof, may be configured and/or shaped such that light 32 reflects, within retroreflector body 110, from internal surfaces 118 of the retroreflector body. This reflected light then exits the retroreflector body, via light-receiving region 130, as emitted fraction 42 of the light. To permit and/or facilitate this reflection, retroreflector body 110 and/or tapered region 116 thereof may, in some examples, be an at least partially pyramidal retroreflector body, an at least partially 3-sided pyramidal retroreflector body, an isosceles pyramidal retroreflector body, and/or an at least partially isosceles pyramidal retroreflector body.

Figure 10:
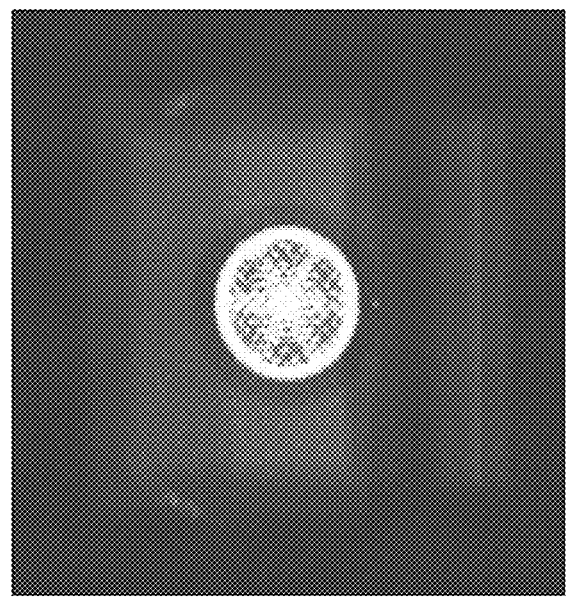
FIG. 10 illustrates light intensity of light reflected from the retroreflector of FIGS. 5-8 as determined by the model of FIG. 9.

In some examples, retroreflector 106, retroreflector body 110, and/or tapered region 116 may be shaped such that emitted fraction 42 of the light has and/or defines a predetermined light pattern when received by the imaging device. As an example, and with reference to FIGS. 4-7, retroreflector 106 may include a 3-sided pyramidal tapered region 116 that at least partially extends from an arcuate surface 108. In such examples, and as illustrated in FIG. 10, the predetermined light pattern may include and/or be a circular shape and/or a circular light pattern. As another example, and with reference to FIGS. 11-13, retroreflector 106 may include, or may only include, the 3-sided pyramidal tapered region 116. In such examples, and as illustrated in FIG. 16, the predetermined light pattern may include and/or be a polygonal shape, a segmented polygonal shape, a hexagonal shape, and/or a segmented hexagonal shape.

The ability to produce and/or generate the predetermined light pattern, utilizing retroreflector 106 of probe 100, may provide distinct benefits in the context of probe system 10 that is illustrated in FIG. 3. As an example, the retroreflector that is illustrated in FIGS. 4-7, which produces the predetermined light pattern illustrated in FIG. 10, may be relatively less sensitive to small errors in the height of probe tip 120, may be in focus to imaging device 40 within a relatively broader focus range, and/or may produce a relatively brighter spot on retroreflector 106 over the broader focus range. Such a configuration may be beneficial when the height of the probe is less well-resolved by the imaging device and/or when a primary purpose for imaging the probe is to determine a position of the probe relative to and/or within a plane of the substrate that extends below the probe.

Figure 11:
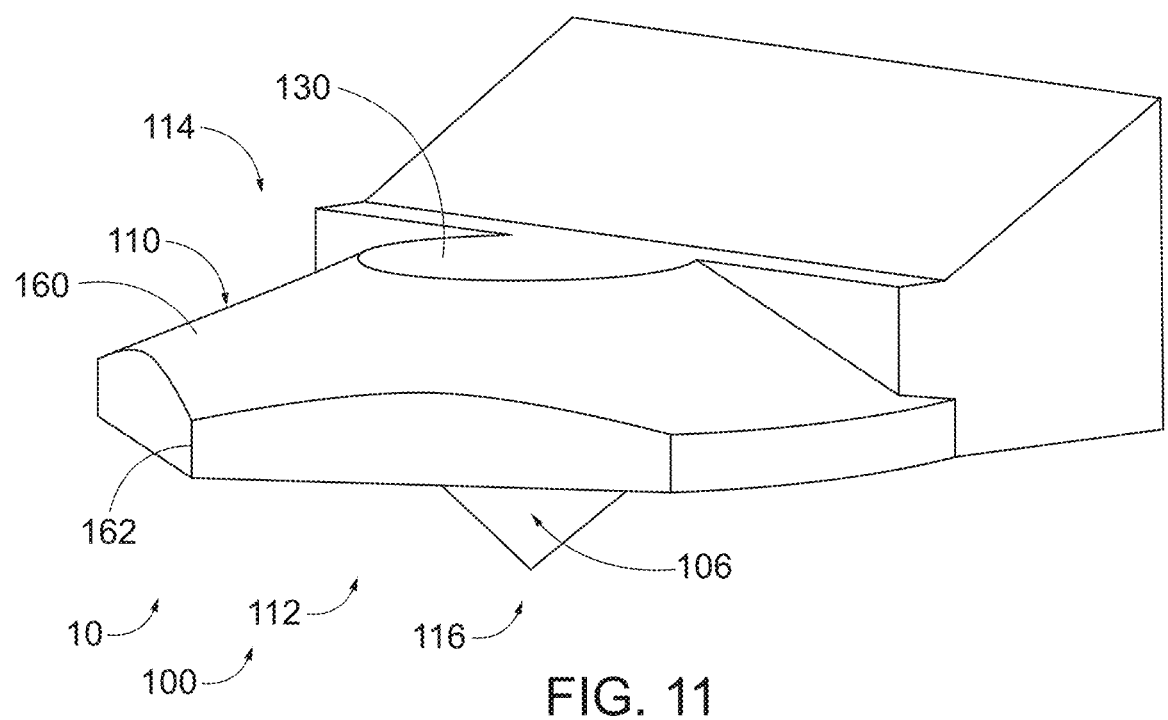
FIG. 11 is a schematic perspective view of an example of a retroreflector that may form a portion of a probe according to the present disclosure.
Figure 12:
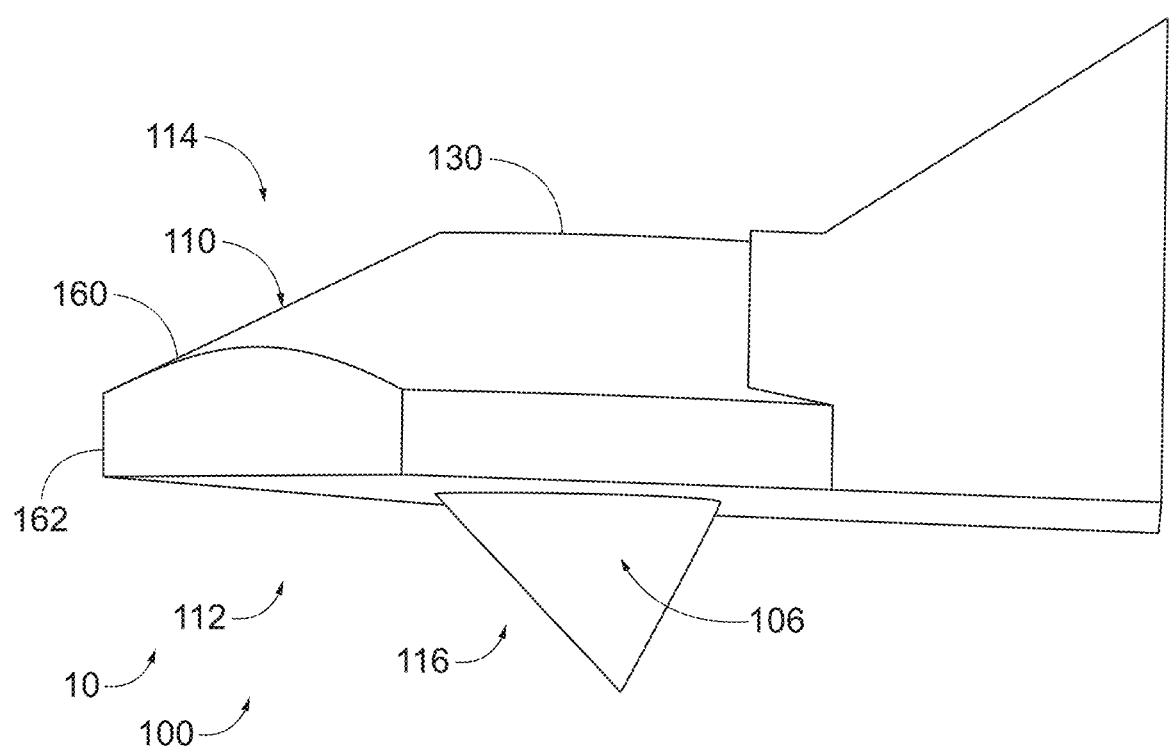
FIG. 12 is a schematic side view of the retroreflector of FIG. 11.
Figure 13:
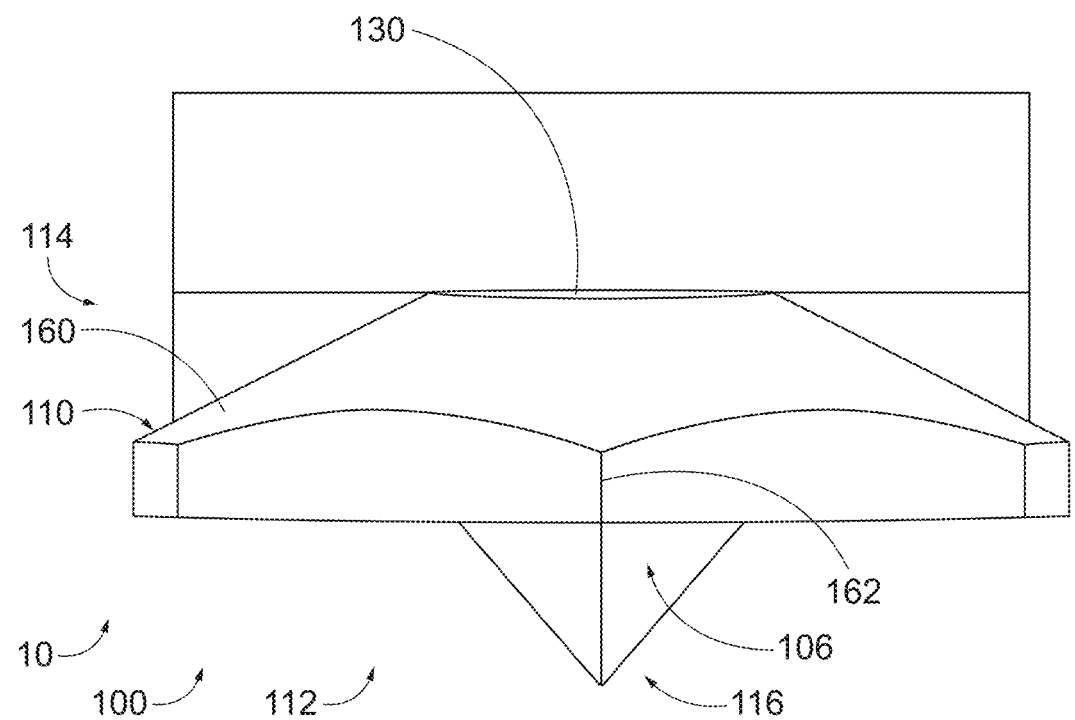
FIG. 13 is a schematic front view of the retroreflector of FIGS. 11-12.
Figure 16:
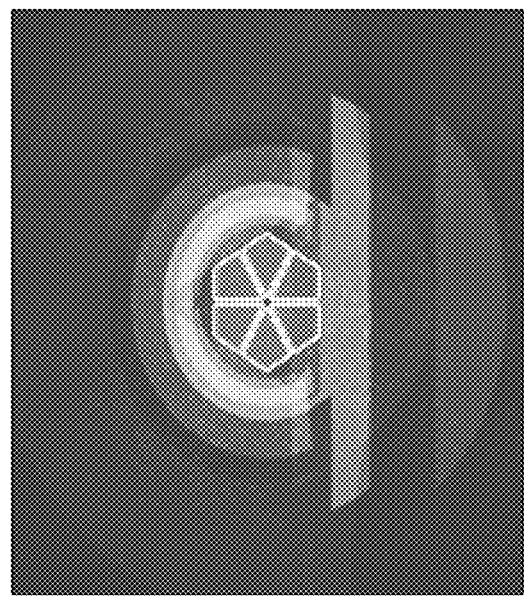
FIG. 16 illustrates light intensity of light reflected from the retroreflector of FIGS. 11-14 as determined by the model of FIG. 15.
Figure 17:
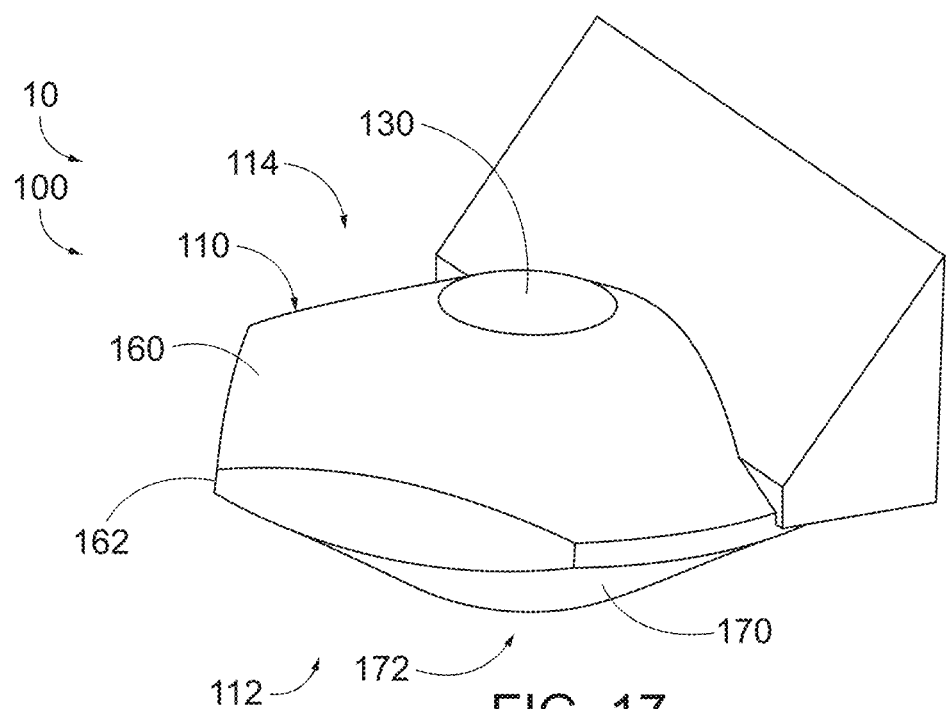
FIG. 17 is a schematic perspective view of an example of a retroreflector that may form a portion of a probe according to the present disclosure.
Figure 18:
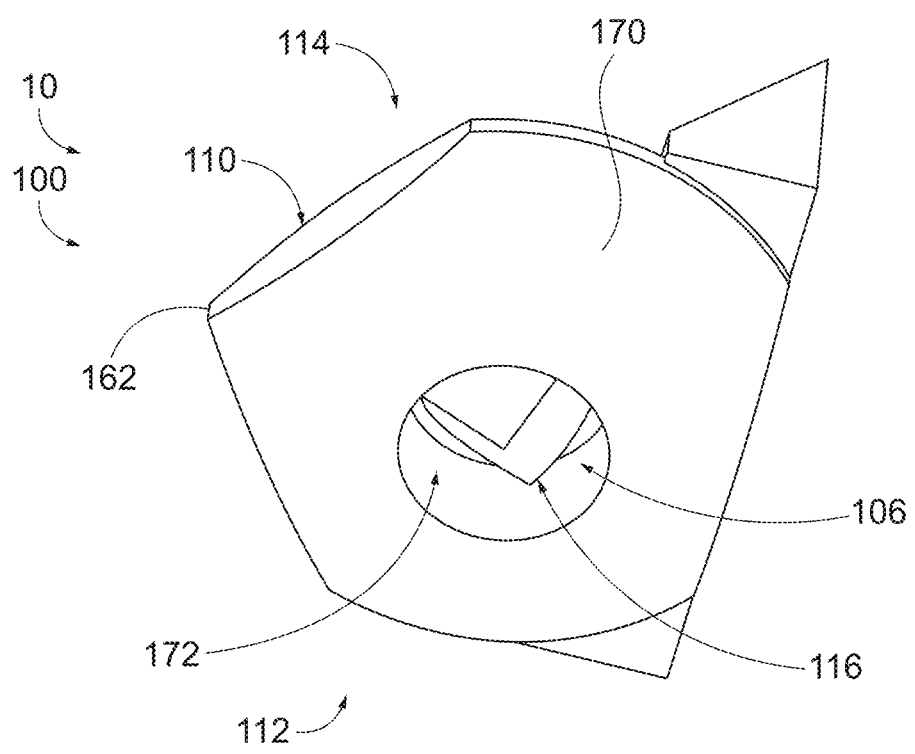
FIG. 18 is another schematic perspective view of the retroreflector of FIG. 17.
Figure 19:
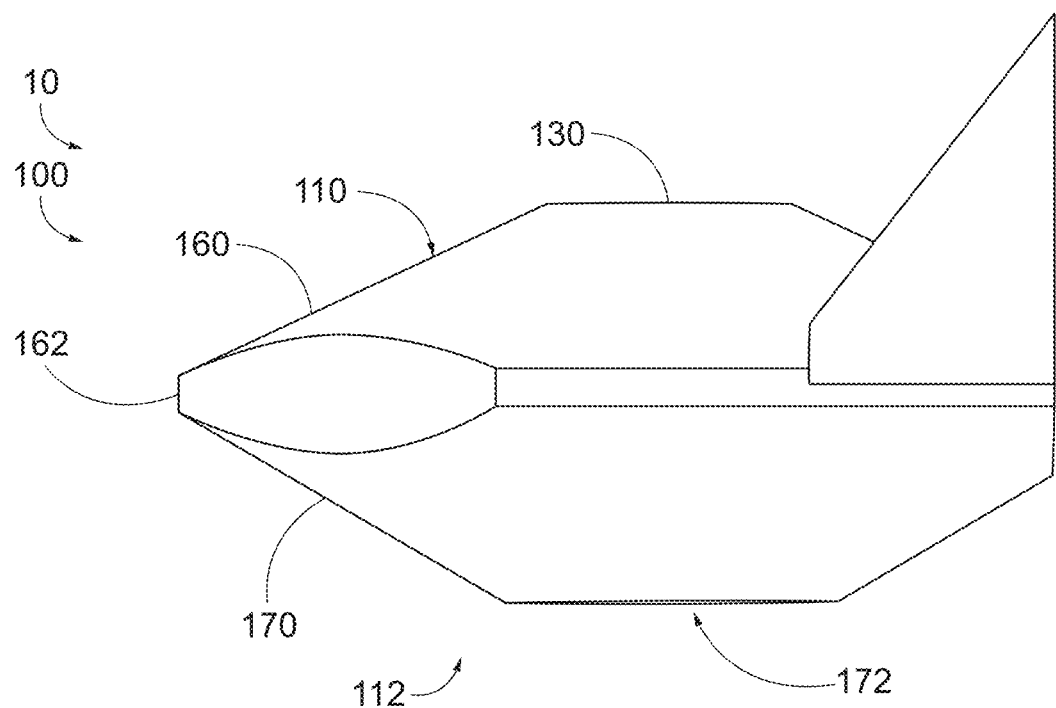
FIG. 19 is a schematic side view of the retroreflector of FIGS. 17-18.
Figure 20:
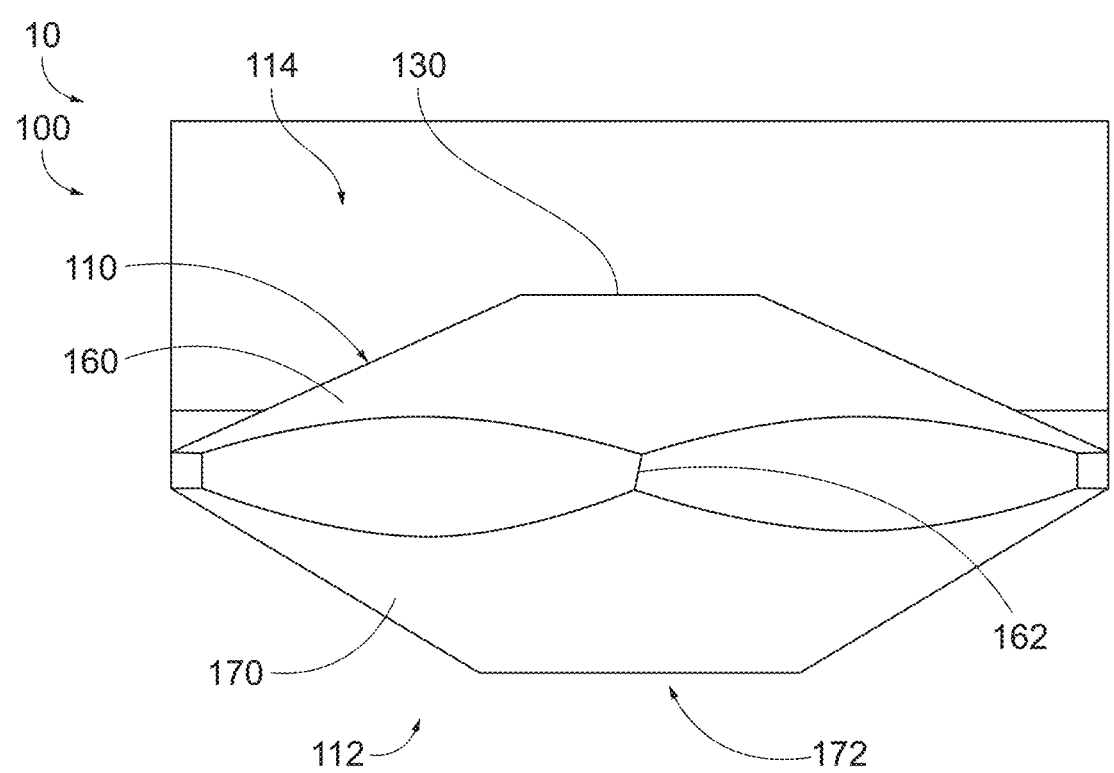
FIG. 20 is a front view of the retroreflector of FIGS. 17-19.

As another example, the light pattern illustrated in FIG. 16, which may be produced by the retroreflector that is illustrated in FIGS. 11-13, only may be visible to the imaging device within a relatively small and/or tight focus range. Such a configuration may be beneficial when the height of the probe is well-resolved by the imaging device and/or when a primary purpose for imaging the probe is to accurately focus the imaging device on the probe, such as to determine the height of the probe above the substrate.

As illustrated in dashed lines in FIG. 3 and in solid lines in FIGS. 4-9, 11-15, 17, and 19-20, probe 100 may include, retroreflector body 110 may define, and/or second side 114 may include and/or define, a background offset region 160. Background offset region 160, when present, may be configured to convey, to refract, and/or to reflect, light 32, which may be incident thereon at light angle of incidence 34, away from retroreflector body 110 at an offset region angle that differs from the light angle of incidence. Stated another way, background offset region 160 may be configured to convey the light away from imaging device 40. This is illustrated in FIGS. 9 and 15, with light that enters retroreflector 106 via light-receiving region 130 being emitted toward imaging device 40, while light that is incident upon background offset region 160 is directed away from the imaging device.

Figure 8:
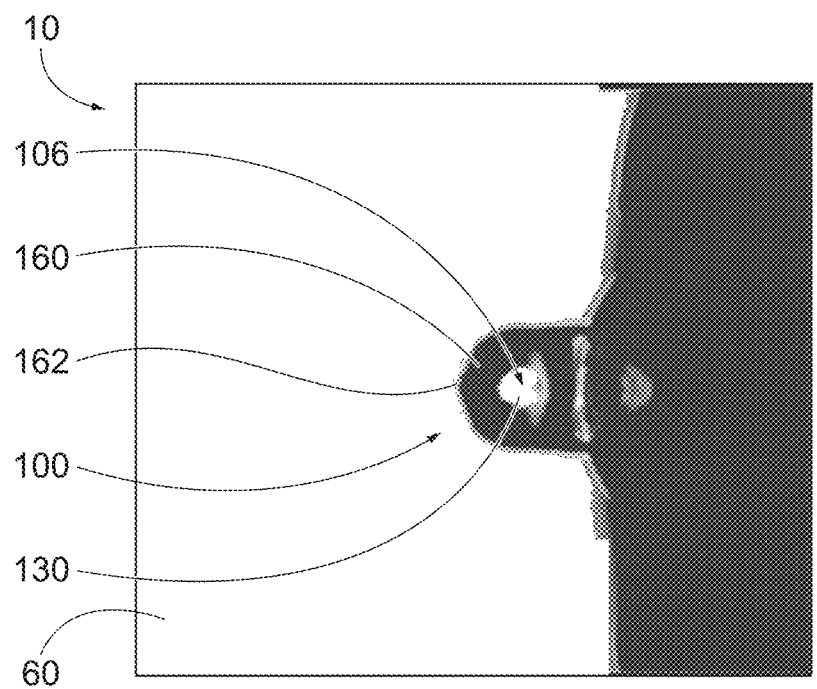
FIG. 8 is a top view image of a retroreflector with a shape similar to that of the schematic retroreflectors of FIGS. 5-7.
Figure 9:
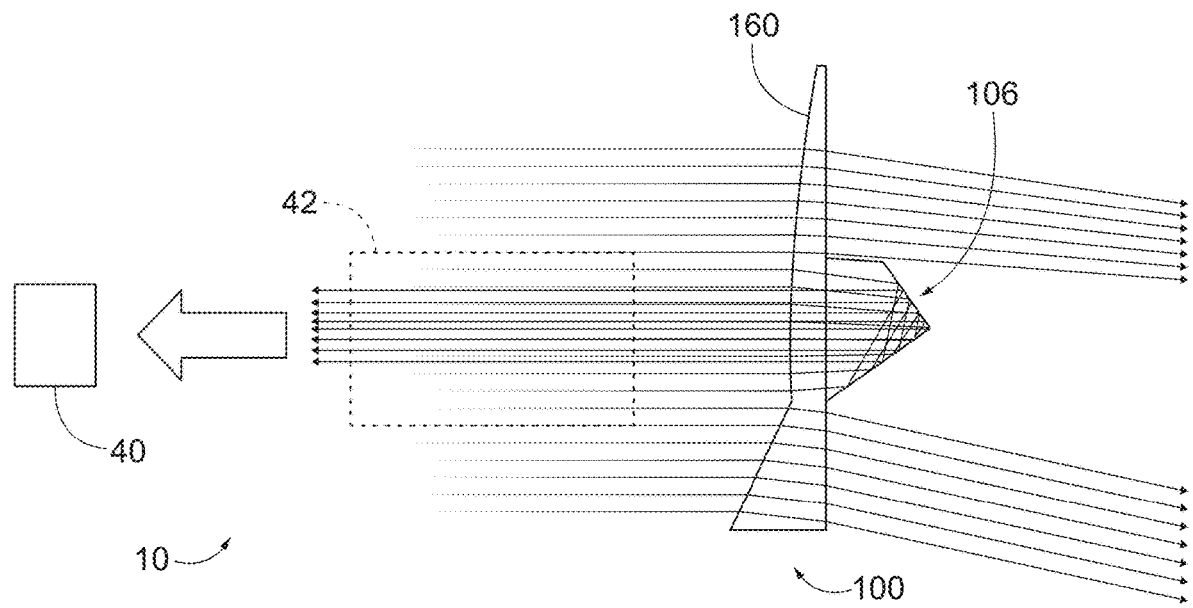
FIG. 9 illustrates a model of interaction of light with the retroreflector of FIGS. 5-8.
Figure 14:
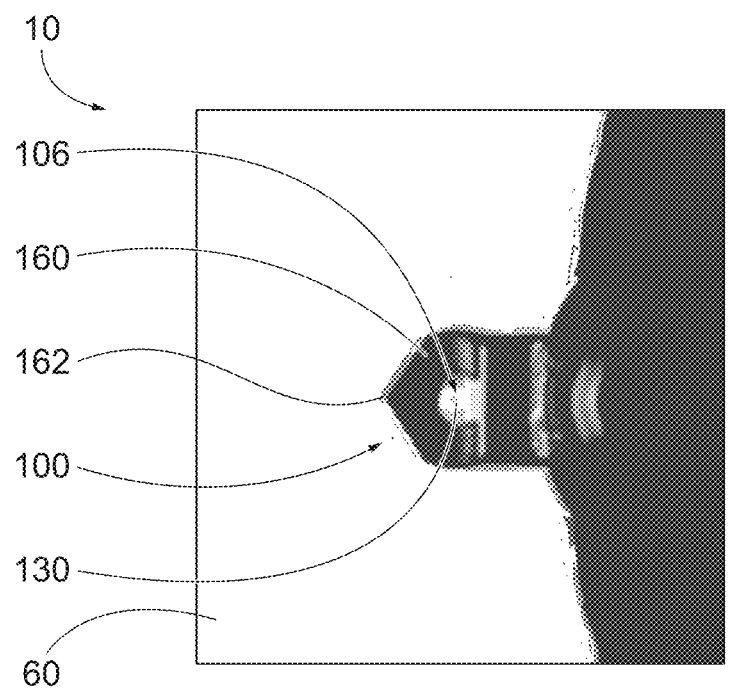
FIG. 14 is a top view image of a retroreflector with a shape similar to that of the schematic retroreflectors of FIGS. 11-13.
Figure 15:
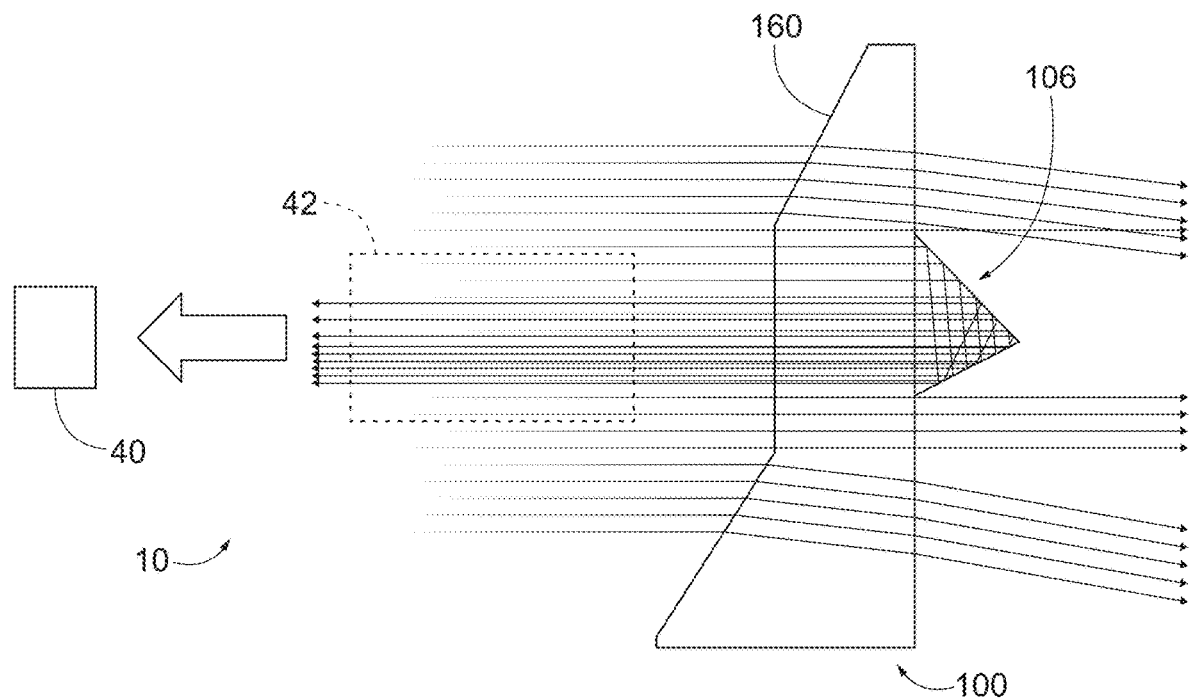
FIG. 15 illustrates a model of interaction of light with the retroreflector of FIGS. 11-14.

As illustrated in FIGS. 8 and 14, such a configuration may provide distinct benefits that may improve an ability to accurately position and/or locate probes 100 relative to substrate 60. As an example, when viewed by the imaging device and as illustrated, background offset region 160 generates a dark region that surrounds, or at least partially surrounds, a bright region generated by retroreflector 106. This dark region provides a built-in, or guaranteed, optical contrast, thereby permitting and/or facilitating alignment of the probe with the substrate regardless of any structure that may be present on, or light that may be received from, the substrate. Stated another way, the dark region generated by background offset region 160 provides a predetermined spatial separation between the bright region generated by the retroreflector and the substrate when viewed by the imaging device, and this predetermined spatial separation may improve an ability to accurately determine the location of the probe utilizing the imaging device. This may be especially true for probe systems 10 that are configured to utilize automated routines to determine the location of the probe utilizing the imaging device.

Background offset region 160 may have any suitable size, shape, and/or orientation relative to retroreflector 106 and/or light-receiving region 130. As an example, the background offset region may surround, or at least partially surround, the light-receiving region. As another example, the background offset region may have an offset region surface area, the light-receiving region may have a light-receiving region surface area, and a ratio of the light-receiving region surface area to the offset region surface area may be at least 0.05, at least 0.1, at least 0.15, at least 0.2, at least 0.25, at least 0.3, at least 0.35, at least 0.4, at least 0.45, at least 0.5, at most 6, at most 5.5, at most 5, at most 4.5, at most 4, at most 3.5, at most 3, at most 2.5, at most 2, at most 1.5, and/or at most 1. As yet another example, the background offset region may be defined on and/or by second side 114 of retroreflector body 110. As another example, the background offset region may extend away from light-receiving region 130 and/or may taper from the light-receiving region toward first side 112 of the retroreflector body. As another example, the background offset region may be at least partially conic.

In some examples, background offset region 160 may include and/or define a projecting region 162, which also may be referred to herein as a projecting tip 162. Projecting region 162, when present, may project and/or extend away from light-receiving region 130 as measured within a plane that is defined by the light-receiving region. Such a configuration may permit projecting region 162 to be utilized as an alternative, or complementary, reference point to facilitate improved alignment between the probe and the substrate via optical viewing utilizing the imaging device.

As illustrated in dotted lines in FIG. 3 and in solid lines in FIGS. 17-20, probes 100 also may include a first side background offset region 170. When probes 100 include first side background offset region 170, background offset region 160 also may be referred to herein as second side background offset region 160, and the offset region angle also may be referred to herein as a second side offset region angle. First side background offset region 170 may face away from second side background offset region 160. Similar to second side background offset region 160, first side background offset region 170, when present, may be configured to convey, to refract, and/or to reflect, light, which may be incident thereon, away from retroreflector body 110, away from retroreflector 106, and/or away from imaging device 40. As such, the presence of second side background offset region 170 further may increase the optical contrast, or brightness difference, between light-receiving region 130 and background offset region 160 when light is incident upon light-receiving region 130 and reflected back to imaging device 40.

First side background offset region 170 may include any structure and/or may define any suitable shape. As an example, first side background offset region 170 may surround, or at least partially surround, retroreflector 106 and/or tapered region 116 thereof. As a more specific example, first side background offset region 170 may define, at least partially define, bound, and/or at least partially bound a recessed region 172, and retroreflector 106 and/or tapered region 116 may extend at least partially, or even completely, within the recessed region.

As another example, first side background offset region 170 may extend at a skew angle relative to light-receiving region 130 and/or relative to second side background offset region 160. As another example, first side background offset region 170 may be at least partially conic. As yet another example, first side background offset region 170 may taper away from light-receiving region 130, may taper away from second side background offset region 160, and/or may taper toward tapered region 116.

Probe tip 120 may include any suitable structure that may be operatively attached to and/or defined by probe 100 and/or that may be configured to communicate with DUT 62, as illustrated in FIGS. 3-4. As an example, and as illustrated in FIG. 3, probe tip 120 may include a communication structure 150, which may be configured to convey test signal 52 to the DUT and/or to receive resultant signal 54 from the DUT.

An example of communication structure 150 includes an electrical conduit 152, which may be configured for electrical and/or contact communication with a corresponding contact pad 64 of the DUT. Electrical conduit 152, when present, may be configured to convey the electric test signal to the DUT and/or to receive the electric resultant signal from the DUT. Additional examples of communication structure 150 include an optical conduit 154 and/or an antenna 156, which may be configured for wireless and/or non-contact communication with a corresponding coupling structure 66 of the DUT. Optical conduit 154, when present, may be configured to convey the optical test signal to the DUT and/or to receive the optical resultant signal from the DUT. Similarly, antenna 156, when present, may be configured to convey the electromagnetic test signal to the DUT and/or to receive the electromagnetic resultant signal from the DUT.

In some examples, and as illustrated in FIGS. 3-4, probe tip 120 may be spaced apart and/or distinct from retroreflector 106. In some such examples, the probe tip and the retroreflector may be separate and/or distinct structures, which may be operatively attached to, defined on, and/or formed on the probe. In some examples, and as also illustrated in FIGS. 3-4, probe tip 120 and tapered region 116 both may project away from the probe and/or toward the DUT. In some such examples, the probe tip may project farther than the tapered region. Such a configuration may permit and/or facilitate communication between the probe tip and the DUT without contact, or physical contact, between the substrate and the retroreflector.

Figure 21:
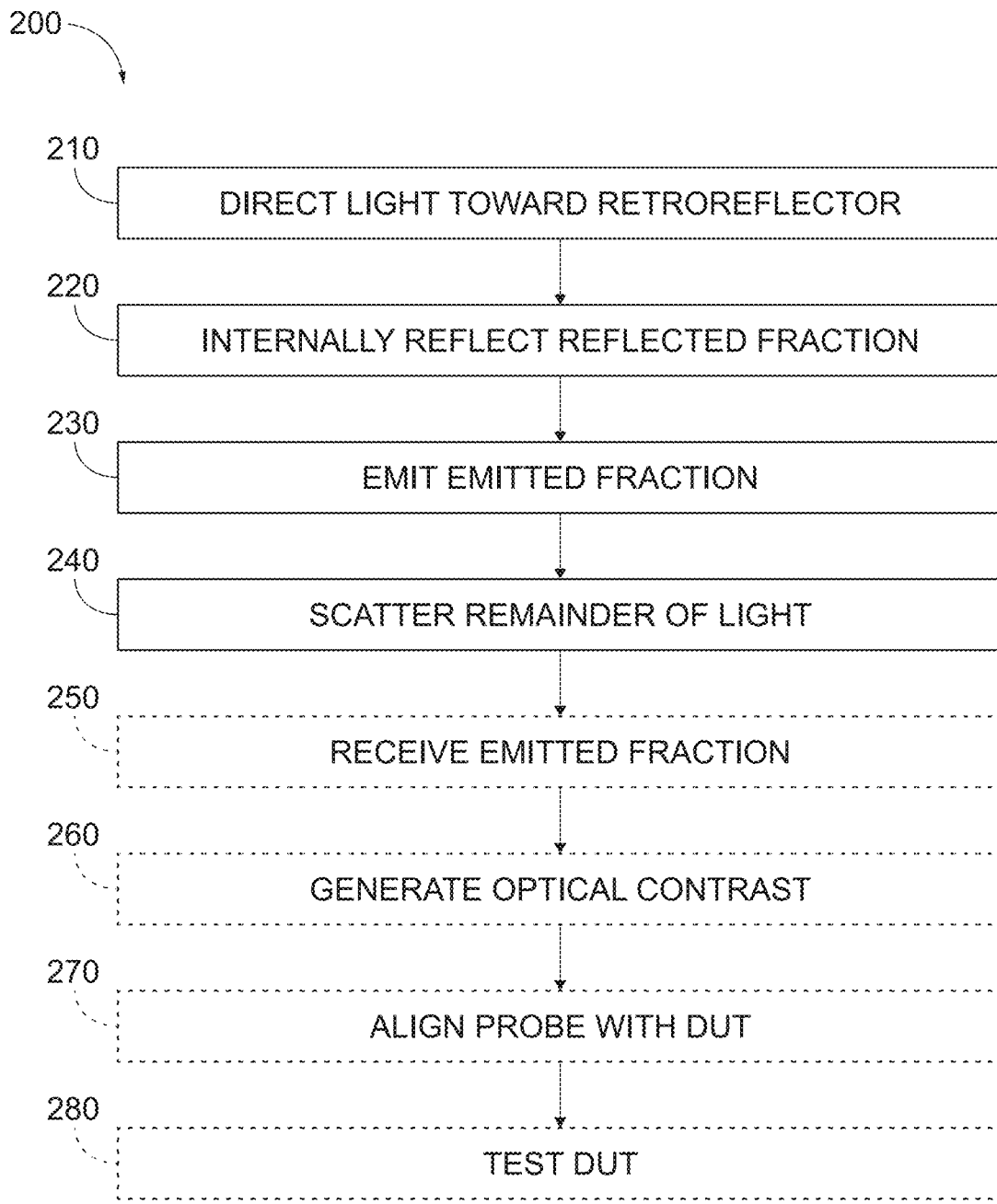
FIG. 21 is a flowchart depicting examples of methods of utilizing a probe, according to the present disclosure.

FIG. 21 is a flowchart depicting examples of methods 200 of utilizing a probe, according to the present disclosure. The probe may be included in and/or may form a portion of a probe system. Examples of the probe are disclosed herein with reference to probe 100. Examples of the probe system are disclosed herein with reference to probe system 10.

Methods 200 include directing light toward a retroreflector at 210 and internally reflecting a reflected fraction of the light at 220. Methods 200 also include emitting an emitted fraction of the reflected fraction of the light at 230 and scattering a remainder of the light at 240. Methods 200 also may include receiving the emitted fraction of the light at 250, generating optical contrast at 260, aligning the probe with a device under test (DUT) at 270, and/or testing the DUT at 280.

Directing light toward the retroreflector at 210 may include directing the light such that the light is incident upon a light-receiving region of the retroreflector at a light angle of incidence. Examples of the light are disclosed herein with reference to light 32. Examples of the light-receiving region are disclosed herein with reference to light-receiving region 130. Examples of the light angle of incidence are disclosed herein with reference to light angle of incidence 34. Examples of the retroreflector are disclosed herein with reference to retroreflector 106.

Internally reflecting the reflected fraction of the light at 220 may include internally reflecting at least the reflected fraction of the light within a retroreflector body of the retroreflector. Examples of the retroreflector body are disclosed herein with reference to retroreflector body 110.

Emitting the emitted fraction of the reflected fraction of the light at 230 may include emitting the emitted fraction from the retroreflector body, via the light-receiving region, and/or at a light angle of emission. Examples of the emitted fraction are disclosed herein with reference to emitted fraction 42. Examples of the light angle of emission are disclosed herein with reference to light angle of emission 44.

Scattering the remainder of the light at 240 may include scattering the remainder of the light such that the remainder of the light propagates from the retroreflector at an angle other than the light angle of emission.

Receiving the emitted fraction of the light at 250 may include receiving the emitted fraction of the light with an imaging device. Examples of the imaging device are disclosed herein with reference to imaging device 40.

Generating optical contrast at 260 may include generating the optical contrast between the light-receiving region and a background offset region of the probe. Examples of the background offset region are disclosed herein with reference to background offset region (or second side background offset region) 160 and/or first side background offset region 170. This may include generating such that the background offset region of the probe at least partially, or even completely, surrounds the light-receiving region. As discussed in more detail herein, such a configuration may permit and/or facilitate improved detection and/or recognition of the emitted fraction of the light that is emitted from the light-receiving region.

The generating at 260 may be performed in any suitable manner. As an example, the generating at 260 may be a result of the scattering at 240. Stated differently, the scattering at 240 may be performed such that, during the receiving at 250, light that is conveyed from the background offset region is not incident upon the imaging device, thereby creating a dark region in any detected image and within the background offset region.

Aligning the probe with the DUT at 270 may include aligning any suitable structure of the probe with a corresponding location on the DUT. As an example, the aligning at 270 may include aligning a probe tip of the probe with a corresponding test location on the DUT. Examples of the probe tip are disclosed herein with reference to probe tip 120. Examples of the corresponding test location are disclosed herein with reference to contact pad 64 and/or coupling structure 66.

The aligning at 270 may be accomplished in any suitable manner. As an example, and when methods 200 include the receiving at 250, the aligning at 270 may be based, at least in part, on the receiving at 250. As a more specific example, and as discussed, the emitted fraction of the light may provide a precise, reproducible, and/or well-defined reference point, on the probe, which may be utilized as a reference for alignment between the probe and the DUT.

Testing the DUT at 280 may include testing the DUT in any suitable manner. This may include quantifying and/or determining functionality of the DUT and/or any suitable performance parameter of the DUT. As examples, the testing at 280 may include providing a test signal to the DUT and/or receiving a resultant signal from the DUT. Examples of the test signal are disclosed herein with reference to test signal 52. Examples of the resultant signal are disclosed herein with reference to resultant signal 54.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probes, probe systems, and methods, according to the present disclosure, are presented in the following enumerated paragraphs.

A1. A probe for a probe system, the probe comprising:
a retroreflector defined by a retroreflector body that includes:
(i) a first side;
(ii) a second, an opposed second, or an at least substantially opposed second, side;
(iii) a tapered region that extends from the first side of the retroreflector body; and
(iv) a light-receiving region that is defined on the second side of the retroreflector body; and
a probe tip configured to at least one of provide a test signal to a device under test (DUT) and receive a resultant signal from the DUT; and
wherein the retroreflector is configured to receive light, via the light-receiving region, at a light angle of incidence and to emit at least an emitted fraction of the light, from the retroreflector body and via the light-receiving region, at a light angle of emission that is equal, or at least substantially equal, to the light angle of incidence.

A2. The probe of paragraph A1, wherein the retroreflector body is a monolithic, or unitary, retroreflector body.

A3. The probe of any of paragraphs A1-A2, wherein the retroreflector body is formed via an additive manufacturing process.

A4. The probe of any of paragraphs A1-A3, wherein the retroreflector body is a single retroreflector body that defines at least one of:
(i) an entirety of the retroreflector; and
(ii) the first side, the second side, the tapered region, and the light-receiving region.

A5. The probe of any of paragraphs A1-A4, wherein the retroreflector body is at least one of:
(i) an optically transparent retroreflector body; and
(ii) an at least partially optically transparent retroreflector body.

A6. The probe of any of paragraphs A1-A5, wherein the probe tip is configured to communicate with the DUT.

A7. The probe of paragraph A6, wherein the probe tip includes an electrical conduit configured to at least one of convey an electric test signal to the DUT and receive an electric resultant signal from the DUT.

A8. The probe of paragraph A7, wherein the probe tip is configured to physically contact a contact pad of the DUT.

A9. The probe of paragraph A6, wherein the probe tip is configured for non-contact communication with a coupling structure of the DUT.

A10. The probe of paragraph A9, wherein the probe tip includes an optical conduit configured to at least one of convey an optical test signal to the coupling structure of the DUT and receive an optical resultant signal from the coupling structure of the DUT.

A11. The probe of paragraph A10, wherein the probe tip includes an antenna configured to at least one of convey an electromagnetic test signal to the coupling structure of the DUT and receive an electromagnetic resultant signal from the coupling structure of the DUT.

A12. The probe of any of paragraphs A1-A11, wherein the light-receiving region is a planar, or at least substantially planar, light-receiving region.

A13. The probe of any of paragraphs A1-A12, wherein the light-receiving region is at least one of:
  (i) an optically transparent light-receiving region; and
  (ii) an at least partially optically transparent light-receiving region.

A14. The probe of any of paragraphs A1-A13, wherein the light-receiving region is configured to convey the light into the retroreflector body such that the light reflects within the retroreflector body.

A15. The probe of any of paragraphs A1-A14, wherein the light-receiving region is configured to emit the emitted fraction of the light from the retroreflector body subsequent to reflection within the retroreflector body.

A16. The probe of any of paragraphs A1-A15, wherein the light-receiving region is at least partially circular.

A17. The probe of any of paragraphs A1-A16, wherein the retroreflector is at least one of:
  (i) spaced apart from the probe tip; and
  (ii) distinct from the probe tip.

A18. The probe of any of paragraphs A1-A17, wherein the retroreflector is at least partially defined by an internal surface of the retroreflector body.

A19. The probe of any of paragraphs A1-A18, wherein the retroreflector is configured such that the light reflects, within the retroreflector body, from an/the internal surface of the retroreflector body and exits the light-receiving region as the emitted fraction of the light.

A20. The probe of any of paragraphs A1-A19, wherein the tapered region is at least one of:
  (i) an at least partially pyramidal tapered region; and
  (ii) an at least partially 3-sided pyramidal tapered region.

A21. The probe of any of paragraphs A1-A20, wherein the retroreflector is shaped such that the emitted fraction of the light defines a predetermined light pattern.

A22. The probe of paragraph A21, wherein the predetermined light pattern includes a circular shape.

A23. The probe of any of paragraphs A21-A22, wherein the predetermined light pattern includes at least one of:
  (i) a polygonal shape;
  (ii) a segmented polygonal shape;
  (iii) a hexagonal shape; and
  (iv) a segmented hexagonal shape.

A24. The probe of any of paragraphs A1-A23, wherein the probe further includes a background offset region configured to convey light, which is incident thereon at the light angle of incidence, away from the retroreflector body at an offset region angle that differs from the light angle of incidence.

A25. The probe of paragraph A24, wherein the background offset region at least one of: (i) at least partially surrounds the light-receiving region; and
  (ii) surrounds the light-receiving region.

A26. The probe of any of paragraphs A24-A25, wherein the background offset region has an offset region surface area, wherein the light-receiving region has a light-receiving region surface area, and further wherein a ratio of the light-receiving region surface area to the offset region surface area is at least one of:
  (i) at least 0.05, at least 0.1, at least 0.15, at least 0.2, at least 0.25, at least 0.3, at least 0.35, at least 0.4, at least 0.45, or at least 0.5; and
  (ii) at most 6, at most 5.5, at most 5, at most 4.5, at most 4, at most 3.5, at most 3, at most 2.5, at most 2, at most 1.5, or at most 1.

A27. The probe of any of paragraphs A24-A26, wherein the retroreflector body defines the background offset region.

A28. The probe of any of paragraphs A24-A27, wherein the background offset region includes a projecting region that extends away from the light-receiving region within a plane defined by the light-receiving region.

A29. The probe of paragraph A28, wherein the projecting region includes a projecting tip.

A30. The probe of any of paragraphs A24-A29, wherein the background offset region is defined on the second side of the retroreflector body.

A31. The probe of any of paragraphs A24-A30, wherein the background offset region extends away from the light-receiving region and tapers toward the first side of the retroreflector body.

A32. The probe of any of paragraphs A24-A31, wherein the background offset region is a second side background offset region, and further wherein the probe includes a first side background offset region that faces away from the second side background offset region and is configured to convey light, which is incident thereon, away from the retroreflector body at a first side offset region angle that differs from the light angle of incidence.

A33. The probe of paragraph A32, wherein the first side background offset region at least one of:
  (i) at least partially surrounds the tapered region; and
  (ii) at least partially defines a recessed region within which the tapered region extends.

A34. The probe of any of paragraphs A32-A33, wherein the retroreflector body defines the first side background offset region.

A35. The probe of any of paragraphs A32-A34, wherein the first side background offset region is defined on the first side of the retroreflector body.

A36. The probe of any of paragraphs A32-A35, wherein the first side background offset region at least one of:
  (i) extends at a skew angle relative to the light-receiving region;
  (ii) extends at a skew angle relative to the second side background offset region;
  (iii) is at least partially conic; and
  (iv) tapers away from the second side background offset region and toward the tapered region.

B1. A probe system for testing a device under test (DUT) that is formed on a substrate, the probe system comprising:
  a chuck configured to support the substrate;
  the probe of any of paragraphs A1-A36;
  a light source configured to direct the light toward the light-receiving region at the light angle of incidence; and
  an imaging device configured to receive the emitted fraction of the light from the retroreflector at least substantially at the light angle of emission.

B2. The probe system of paragraph B1, wherein the probe system further includes a signal generation and analysis assembly configured to at least one of:
  (i) provide a test signal to the DUT via the probe tip; and
  (ii) receive a resultant signal from the DUT via the probe tip.

B3. The probe system of paragraph B2, wherein the test signal includes at least one of: (i) an electric test signal;
  (ii) an optical test signal; and
  (iii) an electromagnetic test signal.

B4. The probe system of any of paragraphs B2-B3, wherein the resultant signal includes at least one of:
  (i) an electric resultant signal;
  (ii) an optical resultant signal; and
  (iii) an electromagnetic resultant signal.

B5. The probe system of any of paragraphs B1-B4, wherein a/the background offset region of the probe conveys the light away from the imaging device.

C1. A method of utilizing the probe of any of paragraphs A1-A36 or the probe system of any of paragraphs B1-B5, the method comprising:
  directing light toward the retroreflector such that the light is incident upon the light-receiving region at the light angle of incidence;
  internally reflecting at least a reflected fraction of the light within the retroreflector body;
  emitting the emitted fraction of the reflected fraction of the light from the retroreflector body and via the light-receiving region at the light angle of emission; and
  scattering a remainder of light such that the remainder of the light propagates from the retroreflector at an angle other than the light angle of emission.

C2. The method of paragraph C1, wherein the method further includes generating an optical contrast between the light-receiving region and a/the background offset region of the probe, optionally wherein the generating is a result of the scattering.

C3. The method of paragraph C2, wherein the background offset region of the probe at least partially, or completely, surrounds the light-receiving region.

C4. The method of any of paragraphs C1-C3, wherein the method further includes aligning the probe with the DUT.

C5. The method of paragraph C4, wherein the aligning includes aligning a probe tip of the probe with a corresponding test location on the DUT.

C6. The method of any of paragraphs C4-C5, wherein the method further includes receiving the emitted fraction of the light with an/the imaging device, and further wherein the aligning is based, at least in part, on the receiving.

C7. The method of any of paragraphs C1-C6, wherein the method further includes testing the DUT.

C8. The method of paragraph C7, wherein the testing includes at least one of:
  (i) providing a/the test signal to the DUT; and
  (ii) receiving a/the resultant signal from the DUT.

INDUSTRIAL APPLICABILITY

The probes, probe systems, and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe for a probe system, the probe comprising:
  a retroreflector defined by a retroreflector body that includes:
    (i) a first side;
    (ii) an opposed second side;
    (iii) a tapered region that extends from the first side of the retroreflector body; and
    (iv) a light-receiving region that is defined on the opposed second side of the retroreflector body; and
  a probe tip configured to at least one of provide a test signal to a device under test (DUT) and receive a resultant signal from the DUT; and
  wherein the retroreflector is configured to receive light, via the light-receiving region, at a light angle of incidence and to emit at least an emitted fraction of the light, from the retroreflector body and via the light-receiving region, at a light angle of emission that is at least substantially equal to the light angle of incidence; and
  wherein the probe further includes a background offset region configured to convey light, which is incident thereon at the light angle of incidence, away from the retroreflector body at an offset region angle that differs from the light angle of incidence.

2. The probe of claim 1, wherein the retroreflector body is a unitary retroreflector body.

3. The probe of claim 1, wherein the retroreflector body is an at least partially optically transparent retroreflector body.

4. The probe of claim 1, wherein the probe tip is configured to communicate with the DUT.

5. The probe of claim 4, wherein the probe tip is configured to physically contact a contact pad of the DUT, and further wherein the probe tip includes an electrical conduit configured to at least one of convey an electric test signal to the DUT and receive an electric resultant signal from the DUT.

6. The probe of claim 4, wherein the probe tip is configured for non-contact communication with a coupling structure of the DUT, and further wherein the probe tip includes an optical conduit configured to at least one of convey an optical test signal to the coupling structure of the DUT and receive an optical resultant signal from the coupling structure of the DUT.

7. The probe of claim 1, wherein the light-receiving region is an at least substantially planar light-receiving region.

8. The probe of claim 1, wherein the light-receiving region is an at least partially optically transparent light-receiving region.

9. The probe of claim 1, wherein the light-receiving region is configured to convey the light into the retroreflector body such that the light reflects within the retroreflector body.

10. The probe of claim 1, wherein the light-receiving region is at least partially circular.

11. The probe of claim 1, wherein the retroreflector is at least one of:
   (i) spaced apart from the probe tip; and
   (ii) distinct from the probe tip.

12. The probe of claim 1, wherein the retroreflector is at least partially defined by an internal surface of the retroreflector body.

13. The probe of claim 1, wherein the retroreflector is configured such that the light reflects, within the retroreflector body, from an internal surface of the retroreflector body and exits the light-receiving region as the emitted fraction of the light.

14. The probe of claim 1, wherein the tapered region is an at least partially pyramidal tapered region.

15. The probe of claim 1, wherein the retroreflector is shaped such that the emitted fraction of the light defines a predetermined light pattern.

16. The probe of claim 15, wherein the predetermined light pattern includes a circular shape.

17. The probe of claim 15, wherein the predetermined light pattern includes at least one of:
   (i) a polygonal shape;
   (ii) a segmented polygonal shape;
   (iii) a hexagonal shape; and
   (iv) a segmented hexagonal shape.

18. The probe of claim 1, wherein the background offset region at least partially surrounds the light-receiving region.

19. The probe of claim 1, wherein the background offset region includes a projecting region that extends away from the light-receiving region within a plane defined by the light-receiving region, wherein the projecting region includes a projecting tip.

20. The probe of claim 1, wherein the background offset region is defined on the opposed second side of the retroreflector body, and further wherein the background offset region extends away from the light-receiving region and tapers toward the first side of the retroreflector body.

21. The probe of claim 1, wherein the background offset region is a second side background offset region, and further wherein the probe includes a first side background offset region that faces away from the second side background offset region and is configured to convey light, which is incident thereon, away from the retroreflector body at a first side offset region angle that differs from the light angle of incidence.

22. The probe of claim 21, wherein the first side background offset region at least one of:
   (i) at least partially surrounds the tapered region; and
   (ii) at least partially defines a recessed region within which the tapered region extends.

23. A probe system for testing a device under test (DUT) that is formed on a substrate, the probe system comprising:
   a chuck configured to support the substrate;
   the probe of claim 1;
   a light source configured to direct the light toward the light-receiving region at the light angle of incidence; and
   an imaging device configured to receive the emitted fraction of the light from the retroreflector at least substantially at the light angle of emission.

24. A method of utilizing the probe of claim 1, the method comprising:
   directing light toward the retroreflector such that the light is incident upon the light-receiving region at the light angle of incidence;
   internally reflecting at least a reflected fraction of the light within the retroreflector body;
   emitting the emitted fraction of the reflected fraction of the light from the retroreflector body and via the light-receiving region at the light angle of emission; and
   scattering a remainder of light such that the remainder of the light propagates from the retroreflector at an angle other than the light angle of emission.

* * * * *